United States Patent [19]

Cathey et al.

[11] Patent Number: 5,281,500
[45] Date of Patent: Jan. 25, 1994

[54] METHOD OF PREVENTING NULL FORMATION IN PHASE SHIFTED PHOTOMASKS

[75] Inventors: David A. Cathey; Brett Rolfson, both of Boise, Id.

[73] Assignee: Micron Technology, Inc., Boise, Id.

[21] Appl. No.: 754,893

[22] Filed: Sep. 4, 1991

[51] Int. Cl.$^5$ .............................................. G03F 9/00
[52] U.S. Cl. ...................................... 430/5; 430/311; 430/320
[58] Field of Search ........................... 430/5, 311, 320

[56] References Cited

U.S. PATENT DOCUMENTS

| | | | |
|---|---|---|---|
| 4,935,334 | 6/1990 | Boettiger et al. | 430/5 |
| 5,045,417 | 9/1991 | Okamoto | 430/5 |

OTHER PUBLICATIONS

Exploration of Fabrication Techniques for Phase-Shifting Masks, A. K. Pfau et al., Dept. of Electrical Engineering and Computer Sciences, Electronics Research Lab., Univ. of California, Berkeley.
Phase-Shifting and Other Challenges in Optical Mask Technology, B. J. Lin, IBM Chemical Technology Division, Hopewell Junction, NY, Sep. 1990.
Subhalf-Micron Patterning of Negative Working Resist by Using New Phase-Shifting Maska, H. Jinbo et al., J. Vac. Sci. Technolo. B 8(6), Nov./Dec. 1990, pp. 1745–1748.
Modeling Phase Shifting Masks, A. R. Neureuther, Dept. of Electrical Engineering and Computer Sciences, Electronics Research Laboratory, Univ. of Cal., Berkeley.
Fabrication of 64M DRAM with i-Line Phase-Shifting Lithography, K. Nakagawa et al., 1990 IEEE.
Improved Resolution of an i-Line Stepper Using a Phase-Shifting Mask, T. Teraswa et al., J. Vac. Sci. Technolo. B 8(6), Nov./Dec. 1990, pp. 1300–1308.
Phase-Shifting Mask and FLEX Method for Advanced Photo-Lithography, H. Fukuda et al. SPIE vol. 1264 Optical/Laser Microlithography III, 1990.
New Phase-Shifting Mask With Highly Transparent SiO$_2$ Phase Shifters, I. Hanyu et al., SPIE vol. 1264 Optical/Laser Microlithography III, 1990, pp. 167–177.
New Phase Shifting Mask With Self-Aligned Phase Shifters for a Quarter Micron Photolithography, A. Nitayama et al., 1989 IEEE, 3.3.1–3.3.4.
LSI Process Lithography, Recticle, Stepper, DRAM, Nikkei Microdevice, Jul. 1990, pp. 1–32.
The Phase-Shifting Mask II: Imaging Simulations and Submicrometer Resist Exposure, M.D. Levenson et al., IEEE Transactions on Electron Devices, vol. ED-31, No. 6, Jun. 1984, pp. 753–763.
0.3-Micron Optical Lithography Using a Phase-Shifting Mask, T. Terawawa et al., SPIE vol. 1088 Optical/Laser Microlithography II, 1989, pp. 25–33.
Use of a pi-Phase-Shifting X-Ray Mask to Increase the Intensity Slope at Feature Edges, Y.-C. Ku et al., J. Vac. Sci. Technolo., Spec. Issued of Proceedings 1987, Int'l Symposium on Electron Ion and Photon Beams.
Transparent Phase Shifting Mask, Watanabe et al. IEDM, 1990, pp. 821–828.

*Primary Examiner*—Marion E. McCamish
*Assistant Examiner*—Mark A. Chapman
*Attorney, Agent, or Firm*—Angus C. Fox, III

[57] ABSTRACT

A method of preventing null formation is performed on a phase shifted photomask including a clear quartz substrate, dark chrome feature features, and alternating clear phase shifters raised from the substrate. The phase shifter features are terminated in a transmissive, optically clear edge. To prevent null formation and consequent formation of stringers on the surface of the integrated circuit, the substantially vertical edge of the optically clear end of the phase shifter is tapered. The slope at any point along the tapered edge between the photomask substrate and the phase shifter is set to an angle, typically less than forty-five degrees, shallow enough that the point spread function does not produce an image. The point spread function of the imaging system spreads out the null, which is therefore not printed into the photoresist layer on the integrated circuit. The tapered edge of the phase shifter is created by either discrete or continuous etching methods. Both methods create the phase shifter and tapered edges simultaneously and are compatible with photomasks having either additive or subtractive type phase shifters.

26 Claims, 7 Drawing Sheets

METHOD OF PREVENTING NULL FORMATION IN PHASE SHIFTED PHOTOMASKS

BACKGROUND OF THE INVENTION

This invention relates generally to phase shifted photomasks, and more particularly to a method for preventing undesirable null formation when the pattern on the phase shifted mask is transferred to the surface of an integrated circuit.

Figure 1A:
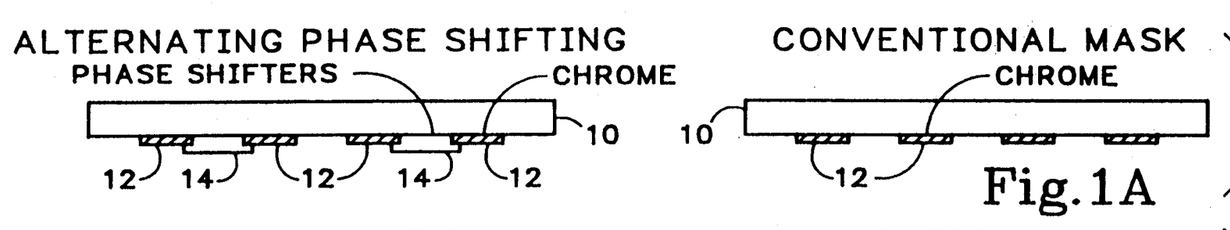
FIGS. 1A-1D are combined cross-sectional views of a conventional and phase shifted photomask, with accompanying plots showing the resultant electric field and intensity.

Phase shifting is a technique known in the art of photolithography to enhance the contrast of images printed onto the surface of an integrated circuit. Phase shifted photomasks are useful for allowing feature sizes of the printed images to be reduced below 0.5 μm. A conventional and phase shifted photomask is shown in FIG. 1A. The conventional photomask includes a clear substrate 10 typically fabricated out of quartz, and a plurality of dark features 12 typically fabricated out of chrome. The dark features 12 represent metal runs, transistor contacts, transistor active areas, as well as all other patterned areas for a specific layer of the integrated circuit. The phase shifted photomask also includes substrate 10 and dark features 12, but in addition includes a number of additional clear phase shifting features 14 (also known simply as "phase shifters".) The phase shifters 14 are an extra patterned layer of transmissive material on the surface of the photomask. As light propagates through the substrate 10 and the extra phase shifters 14, its wavelength is reduced from that in air by the refractive indexes of the substrate 10 and the phase shifter 14, respectively. The optical phase difference, $\theta$, between two beams of light traveling through the phase shifted and non-phase shifted portions of the photomask is equal to:

$$\theta = 2\pi a(n-1)/\lambda,$$

wherein "n" is the refractive index and "a" is the thickness of the phase shifter 14. Usually, a phase shift of $\pi$ is desirable such that:

$$a = \lambda/(2(n-1)).$$

The phase shift can be any odd number of $\pi$, i.e. $(2m+1)\pi$, where $m = 0,1,2, \ldots$. Phase shifting of the two beams is relative, but for simplicity of describing structure and operation, the raised area of the photomask is usually referred to as the phase shifter.

Figure 1B:
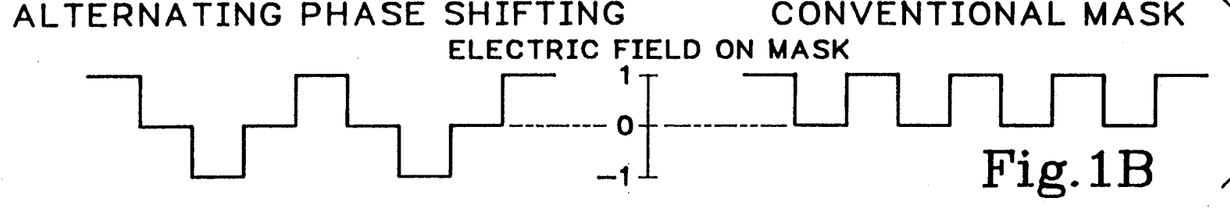
Figure 1C:
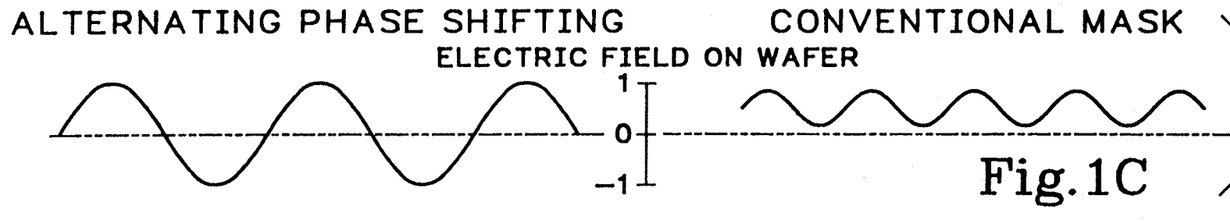
Figure 1D:
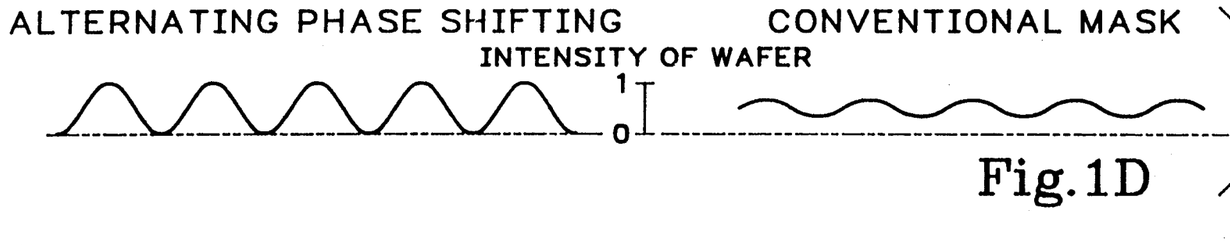

The phase shifted photomask in FIG. 1A is known as "alternating phase shifting" wherein pairs of closely packed dark features 12 contain a raised phase shifter 14. Separating each pair of dark features 12 is a non-phase shifted area of the photomask substrate 10. The operation of the alternating phase shifted photomask, contrasted with the operation of a conventional photomask, is shown in FIGS. 1B-1D. In sequence, the figures show the electric field on the mask, the electric field on the wafer, and the intensity on the wafer. The "−1" amplitude created by the phase shifters 14 effectively reduces the spatial frequency of the electric field so that it is less inhibited by the lens transfer function of the imaging system used and forms a higher-contrast amplitude image at the wafer plane. When the electric field is recorded by the photoresist, only the intensity that is proportional to the square of the electric field amplitude is recorded, resulting in doubling of the reduced spatial frequency, i.e. restoring to the spatial frequency of the original object but producing an image of much higher contrast. In addition to the reduction of spatial frequency, the electric field is forced to pass through zero to −1. Thus, edge contrast is improved. Therefore, the alternating phase shifting system benefits from the reduction of spatial frequencies as well as enhancement of the edge contrast.

Figure 2A:
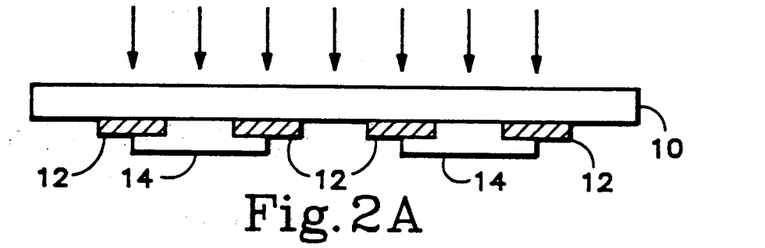
FIG. 2A is a cross-sectional view of a phase shifted photomask constructed with an additive process.
Figure 2B:
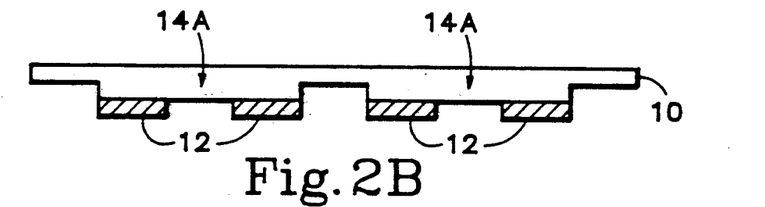
FIG. 2B is a cross-sectional view of a phase shifted photomask constructed with a substractive process.

Two types of alternating phase shifted photomasks are shown in FIGS. 2A-2B. FIG. 2A shows an "additive" phase shifted photomask in which the phase shifters 14 are a patterned layer of transmissive material as described above. FIG. 2B shows a "subtractive" phase shifted photomask in which the phase shifters 14A are formed by etching portions of the substrate 10. Thus, in the subtractive photomask, the unetched portions of the substrate 10 form the phase shifters 14. Although formed by different methods, the operation of the additive and subtractive photomasks is equivalent.

Figures 3, 4:
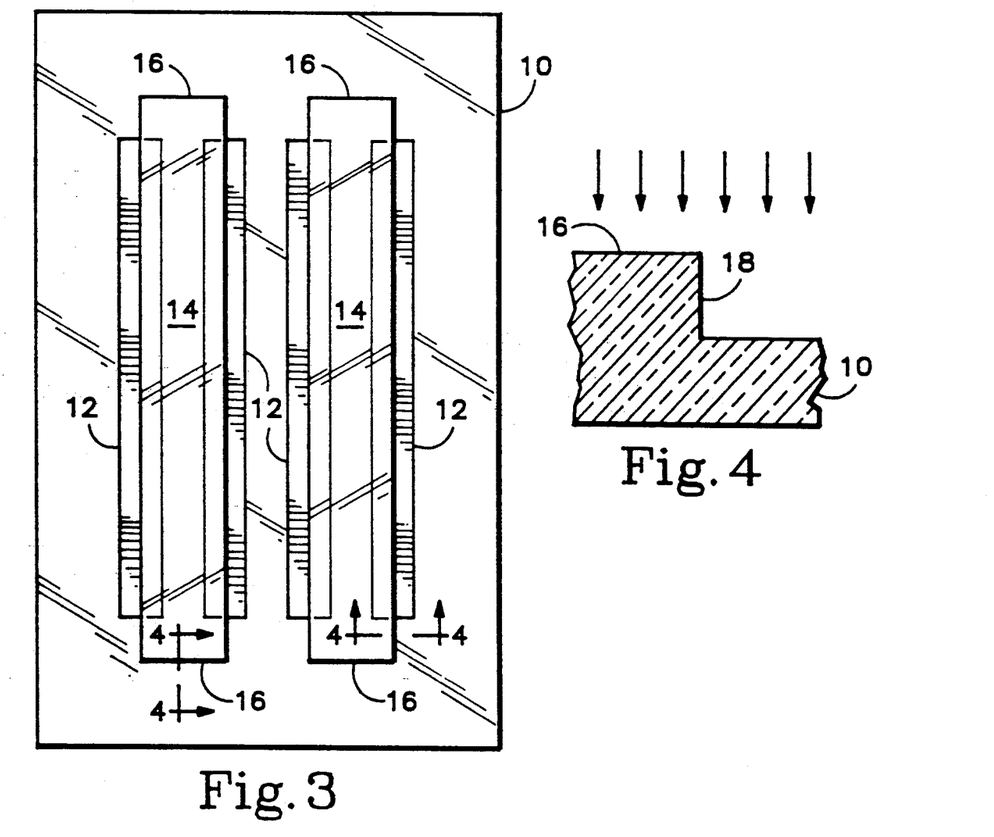
FIG. 3 is a plan view of a portion of a phase shifted photomask.
FIG. 4 is a cross-sectional view taken along lines 4—4 of FIG. 3, particularly illustrating an optically clear edge.

The alternating phase shifting technique works only as long as there are a number of pairs of closely packed dark features 12 on the photomask. As shown in FIG. 3, phase shifters 14 associated with pairs of dark features 12 must be eventually terminated. The phase shifters 14 are terminated because the dark features 12 are themselves terminated, change direction, are unconnected to other features on the photomask, or otherwise change topology. A phase shifter 14 is typically terminated in a transmissive end 16, resulting in a transmissive, optical clear edge. The optically clear edge 18 is shown in FIG. 4. The optically clear edge 18 results in a null, which produces a "stringer" or undesirable dark feature on the integrated circuit. Referring back to FIG. 3, the stringer is printed generally along the thin lines designating the end 16 of phase shifter 14. FIG. 4 only shows the termination of the phase shifter 14 due to the termination of the dark features 12. It is appreciated by those skilled in the art that the optically clear edge 18 and resulting stringers can occur in numerous other configurations.

Figure 5A:
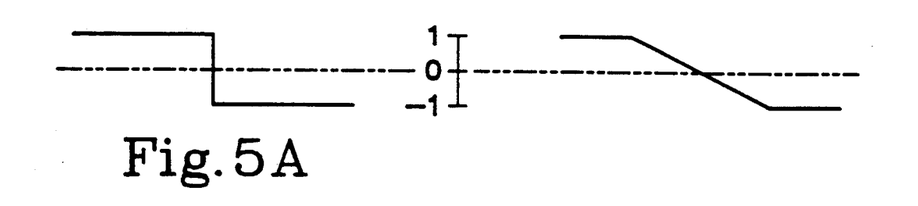
FIGS. 5A-5C are plots of electric field and intensity for a conventional phase shifted mask and a phase shifted mask having a tapered edge according to the present invention.
Figure 5B:
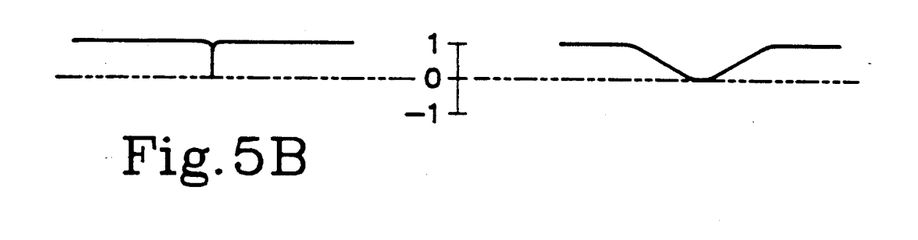
Figure 5C:
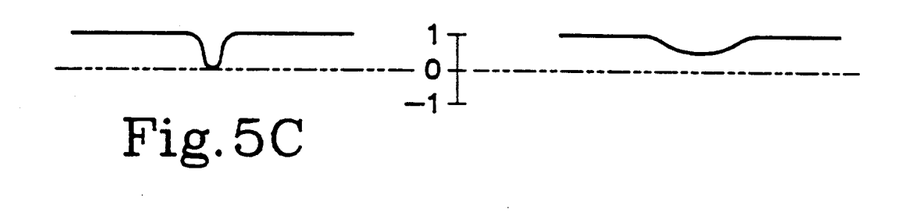

The performance of a prior art phase shifted photomask is shown in FIGS. 5A-5C. The electric field produced by a conventional phase shifted photomask is shown in FIG. 5A. Although the edge 18 of the phase shifter is optically clear, the phase shifted light passing through the phase shifter passes through zero electric field. The light from the imaging system does not pass through the phase shifter exactly at the edge 18. The square of the electric field is shown in FIG. 5B, wherein the square generally has a value of 1, but is equal to zero at the location of edge 18. The intensity on the wafer is shown in FIG. 5C. The electric field on the photomask passes through a narrow zone of zero electric field, which is spread out due to the "point spread function" of the optical imaging system. However, the intensity is still relatively narrowly focused and is printed as an actual feature by the photoresist layer on the integrated circuit.

Accordingly, a need remains for a method of removing undesirable null formation in a phase shifted photomask while retaining the benefits of phase shifting.

SUMMARY OF THE INVENTION

It is an object of the invention to remove undesirable stringers from being printed onto the surface of an integrated circuit that result from optically clear edges of phase shifters.

It is an advantage of the present invention that the method of preventing null formation is compatible with photomasks having either additive or subtractive type phase shifters.

According to the present invention, a method of preventing null formation is performed on a phase shifted photomask including a clear quartz substrate, dark chrome feature features, and alternating clear phase shifters raised from the substrate. The phase shifter features are terminated in a transmissive, optically clear edge. To prevent null formation and consequent formation of stringers on the surface of the integrated circuit, the substantially vertical edge of the optically clear end of the phase shifter is tapered. The slope at any point along the tapered edge between the photomask substrate and the phase shifter is set to an angle shallow enough that the point spread function does not produce an image. For a typical imaging system and photolithography process the slope is set to an angle less than forty-five degrees. Thus, the point spread function of the imaging system spreads out the null, which is therefore not printed into the photoresist layer on the integrated circuit. The tapered edge of the phase shifter is created by one of two etching methods. In a first, continuous method, the photomask is covered with a layer of photoresist that is patterned as required by the design of the mask. The photoresist layer is then isotropically etched to expose a portion of the surface of a phase shifter. The exposed surface of the phase shifter and the photoresist payer are simultaneously and continuously etched to create the tapered edge. In a second, discrete method, the photoresist layer is isotropically etched, followed by a separate step to etch the exposed surface of the phase shifter. The two etching steps are repeated, which creates a plurality of successive stairsteps approximating a tapered edge. Both methods create the phase shifter and tapered edges simultaneously and are compatible with photomasks having either additive or subtractive type phase shifters.

The foregoing and other objects, features and advantages of the invention will become more readily apparent from the following detailed description of a preferred embodiment of the invention which proceeds with reference to the accompanying drawings.

DETAILED DESCRIPTION

Figure 6:
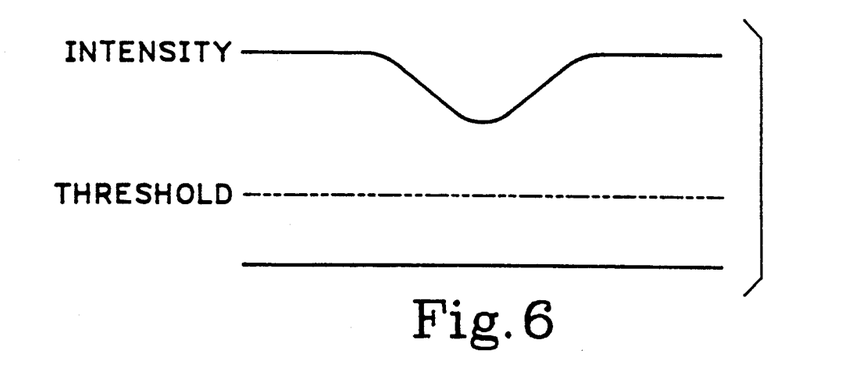
FIG. 6 is a plot of the intensity on the wafer in relationship to the photoresist imaging threshold for the photomask of the present invention.

The performance of the phase shifted photomask according to the present invention is contrasted with the performance of a conventional phase shifted photomask in FIGS. 5A-5C. The left side of FIGS. 5A-5C show the electric field and intensity produced by a vertical transmissive edge 18 of the conventional phase shifter. The right side of FIGS. 5A-5C show the electric field and intensity produced by a tapered transmissive edge of the phase shifter according to the present invention. The electric field of a tapered transmissive edge is shown in FIG. 5A. Although the edge 18 of the phase shifter is optically clear and tapered, the phase shifted light passing through the phase shifter still passes through zero electric field. The light from the imaging system cannot pass through the phase shifter exactly at the edge 18. The square of the electric field is shown in FIG. 5B, wherein the square generally is equal to zero at the location of edge 18, but gradually returns to a value of 1 on either side of the edge location. The intensity on the wafer is shown in FIG. 5C. The electric field on the photomask passes through the narrow zone of zero electric field, which is now much more spread out due to the point spread function of the optical imaging system. The intensity is focused over a wider area and is not printed as an actual feature by the photoresist layer on the integrated circuit. This is shown in greater detail in FIG. 6. There is a dip in the intensity on the surface of the wafer, but the dip is not sufficient to be printed by the photoresist layer. The threshold of the photoresist layer is well below the lowest point of the intensity dip due to the null. In this manner, stringers are effectively eliminated from the integrated circuit.

The sequential process steps for a additive phase shifted photomask having tapered phase shifter edges are shown in FIGS. 7-13. FIGS. 7-13 are not necessarily drawn to scale and do not purport to show an actual cross section of a typical photomask. However, FIGS. 7-13 clearly illustrate the method of the present invention for additive type phase shifting photomasks. In particular, the method is demonstrated in relationship to optically opaque phase shifter edges (left side of the drawing figure) and optically clear phase shifter edges that cause undesirable null formations (far right side of the drawing figure.) The method begins with a photomask having a clear quartz substrate 10 and a plurality of dark chrome features 12. The dark features 12 can also be fabricated of other materials opaque to the exposing wavelength such as aluminum, iron oxide, tungsten, gold, and other materials known in the art. The material selected for the dark features 12, however, is desirably selected to be resistant to the phase shifter etch used. (Typically a fluorine based etchant as is described below.) A clear phase shifting layer 20 of $SiO_2$, $Si_3N_4$, or other forms of nitridized silicon is added to the surface of the substrate 10. The material of the phase shifting layer is selected such that the transparency and refractive index thereof is desirably close (within 10%) to the transparency and refractive index of the substrate 10 at the exposure wavelength. Ultimately, additive type phase shifters 14A and 14B (best seen in FIG. 12) are created having tapered edges. The slope at any point along the tapered edge between the photomask substrate 10 and the phase shifters 14A and 14B is set to an angle shallow enough that the point spread function does not print an image. For a typical imaging system and photolithography process, the slope is set to an angle less than forty-five degrees. The steps of adding the phase shifters 14A and 14B and tapering the edges are performed simultaneously and described in greater detail below.

Figure 7:
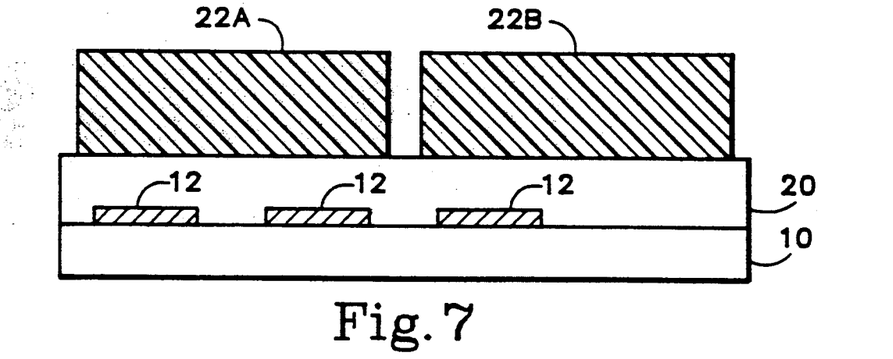
FIGS. 7-13 are cross-sectional views illustrating sequential process steps for an additive phase shifted photomask according to the present invention.

Referring now to FIG. 7, the entire phase shifting layer 20 is covered with a patterned layer of photoresist 22, represented by first and second photoresist zones 22A and 22B. Photoresist zone 22A covers a pair of dark features 12 that will receive phase shifter 14A. The edge of the phase shifter 14A can be either vertical or tapered because of the two dark features 12. The problem of a null location does not exist at such an optically opaque edge. The null from the dark features is desired to be printed on the surface of the integrated circuit and overlaps the null created by the phase shifter edge. However, photoresist zone 22B covers only one dark feature 12 and an area of the phase shift layer 20 that will eventually form an optically clear edge 18. The method described below provides tapered edges for all phase shifters 14. Having tapered edges for all phase shifters simplifies the additive photomask fabrication method.

Figure 8:
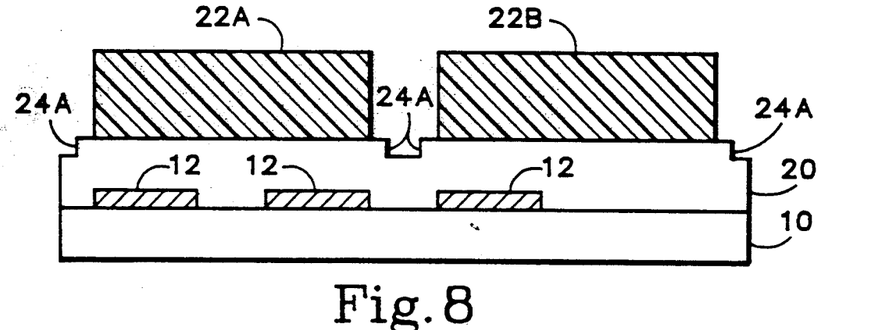

Referring now to FIG. 8, the patterned layer of photoresist 22 is isotropically etched to expose a portion of the surface of the phase shifting layer 20 previously covered by the photoresist layer 22. Photoresist is typically isotropically etched with an $O_2$ or $O_2/N_2$ based plasma etch. The entire exposed surface of the phase shifting layer 20 revealed by the previous isotropic etching step is subsequently etched by another, separate etching step to create a small stairstep 24A. The $SiO_2$ or $Si_3N_4$ phase shifting layer 20 is typically etched with a fluorine based etch such as $SF_6$, $CF_4$, or $CHF_3$, among other etchant species. If the dark features 12 are fabricated with a material other than chrome that is attacked by fluorine, it is desirable to select a different etchant species. Also, if other materials are selected for the phase shifting layer 20, other non fluorinated, compatible etchant species may be required. The steps of isotropically etching the photoresist layer 22 and etching the entire exposed surface of the phase shifting layer 20 are repeated in discrete etching steps to create a plurality of successive stairsteps 24 approximating a tapered edge.

Figure 9:
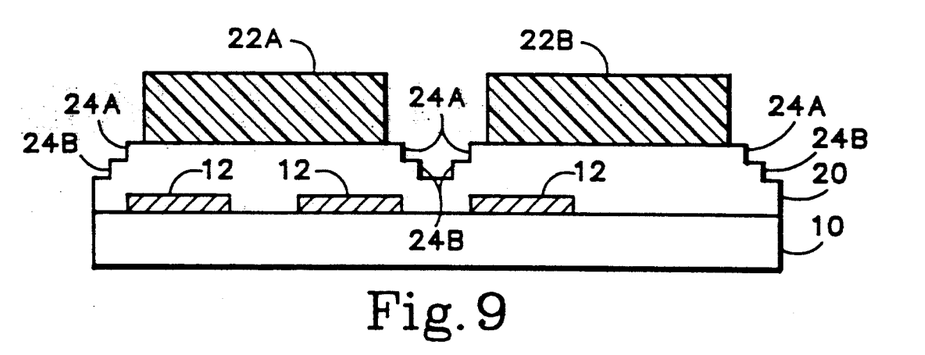
Figure 10:
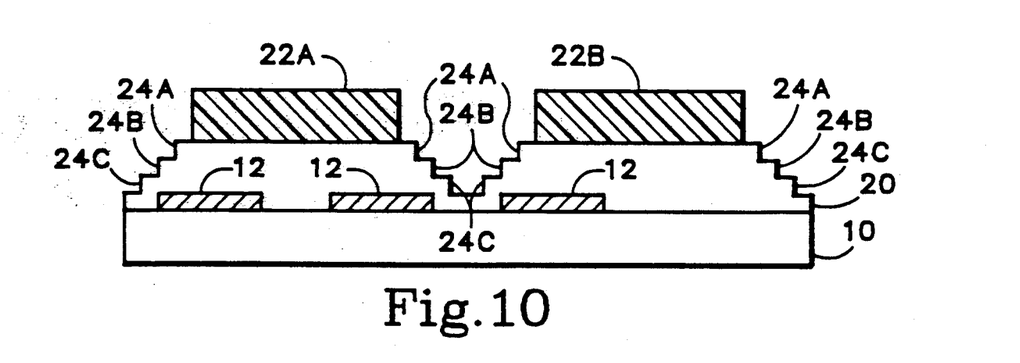
Figure 11:
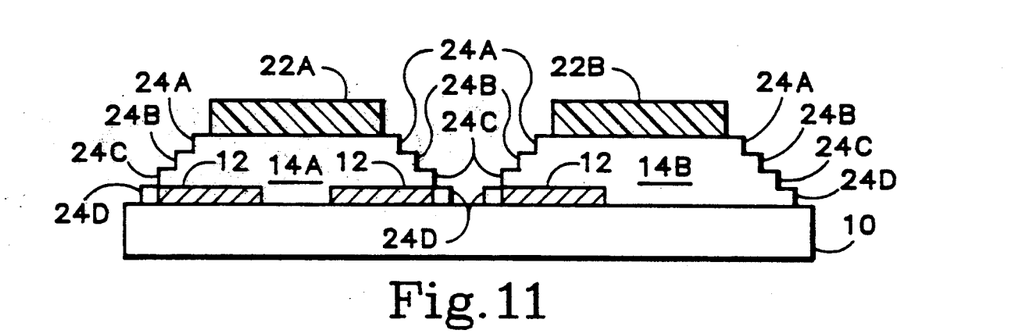
Figure 12:
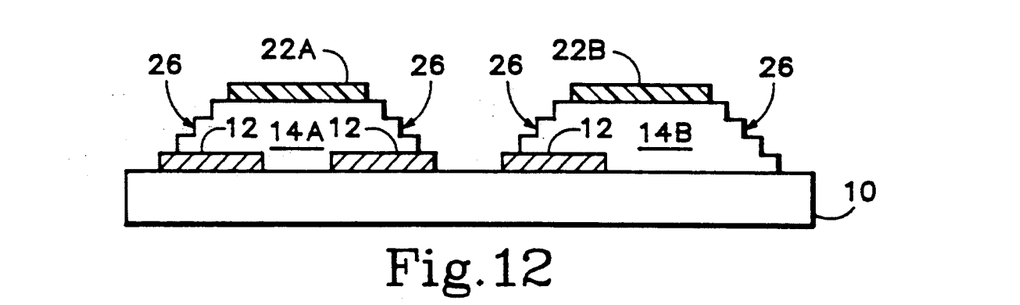
Figure 13:
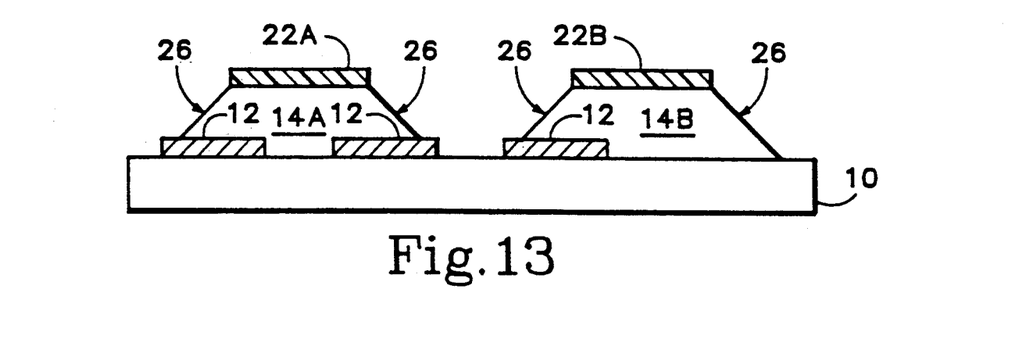
Figure 14:
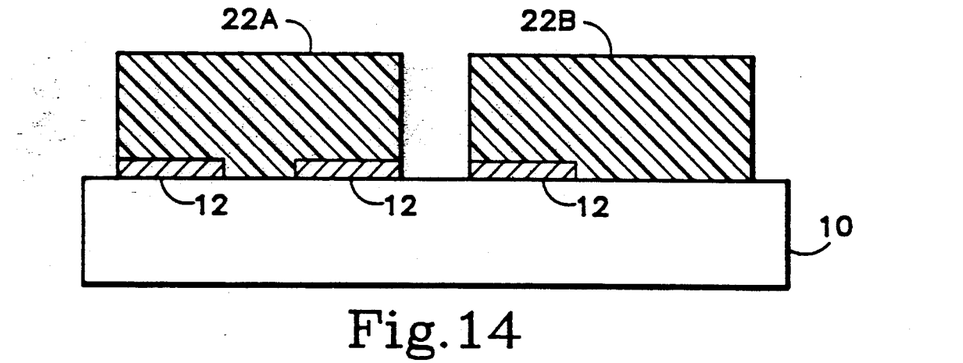
FIGS. 14-20 are cross-sectional views illustrating sequential process steps for a substractive phase shifted photomask according to the present invention.

FIGS. 8-12 illustrate the sequential etching steps, which remove portions of the photoresist and phase shifting layers until two phase shifters 14A and 14B are formed having tapered edges. Either of the two etching steps may be performed first. In some cases it may be desirable to begin with the photoresist etching step. Each drawing figure represents the effect of two discrete etching steps. In FIG. 8, the two etching steps have formed a first stairstep 24A in the phase shifting layer 20, and have reduced both the width and thickness of the photoresist layer 22. In FIG. 9, a second stairstep 24B is created and the width and thickness of the photoresist is further reduced. In FIG. 10, a third stairstep 24C is created and the with and thickness of the photoresist layer is still further reduced. In FIG. 11, the phase shifting layer 20 etched down to the surface of the substrate 10, creating two distinct phase shifters 14A and 14B and the final stairstep 24D. FIG. 12 shows the final form of the phase shifters 14A and 14B. Phase shifter 14A has tapered edges 26, which are not necessary, since light at the edges is blocked by the dark features 12. However, the tapered edges 26 of phase shifter 14A are formed simultaneously with the tapered edges 26 of phase shifter 14B. Here again, the left tapered edge 26 of phase shifter 14B is not required since light is blocked by a dark feature 12. The right tapered edge 26, however, is required to prevent null formation. Forming all of the tapered edges 26 simultaneously does not affect performance at opaque edges, removes null formation at optically clear, transmissive edges, and simplifies photomask construction. Separate operations are not required to form phase shifters with vertical edges and to subsequently taper the edges.

If desired, the isotropic etching of the photoresist layer 22 and the etching the entire exposed surface of the phase shifting layer 20 can be performed simultaneously to create the clear phase shifting features 14A and 14B having smooth, continuous tapered edges 26. For the steps to be performed simultaneously, a combined oxygen/fluorine etch is used wherein the oxygen attacks primarily the photoresist layer 22 and the fluorine based etchant species attacks primarily the phase shifting layer 20. The result of the simultaneous combined etching steps produces the smooth tapered edges 26 shown in FIG. 13. The tapered edges 26 are shown as straight lines having a 45 degree angle due to a constant ratio between the components of the oxygen/fluorine etch. Other smooth shapes can be created by varying the ratio between the components during the etching step.

The sequential process steps for a subtractive phase shifted photomask having tapered phase shifter edges are shown in FIGS. 14-20. As in FIGS. 7-13, FIGS. 14-20 are not necessarily drawn to scale and do not purport to show an actual cross section of a typical photomask. However, FIGS. 14-20 clearly illustrate the method of the present invention for subtractive type phase shifting photomasks. In particular, the method is demonstrated in relationship to optically opaque phase shifter edges (left side of the drawing figure) and optically clear phase shifter edges that cause undesirable null formations (far right side of the drawing figure.) The method begins with a photomask having a clear quartz substrate 10 and a plurality of dark chrome features 12. Ultimately, subtractive type phase shifters 14A and 14B (best seen in FIG. 19) are created having tapered edges, but only at the transmissive, optical clear edges of the phase shifter. The dark features 12 are used to prevent etching at the optically opaque edges of the phase shifter. Thus, portions of the substrate 10 are etched to lower the surface thereof and create a plurality of clear phase shifters 14. The phase shifters are effectively raised from the substrate 10 and have at least one optically opaque edge (containing a dark feature 12) and at least one optically clear edge (containing no dark feature 12.) The optically opaque edges of the phase shifters are preserved by the etch-blocking properties of the dark features 12 and, simultaneously, the optically clear edges of the phase shifters are tapered. As in the previous additive method, the slope at any point along the tapered edge between the photomask substrate 10 and the phase shifter 14B is set to an angle shallow enough that the point spread function does not print an image. The steps of creating the phase shifters 14A and 14B by removing material from the substrate 10 and simultaneously tapering optically clear edges is described in greater detail below.

Figure 15:
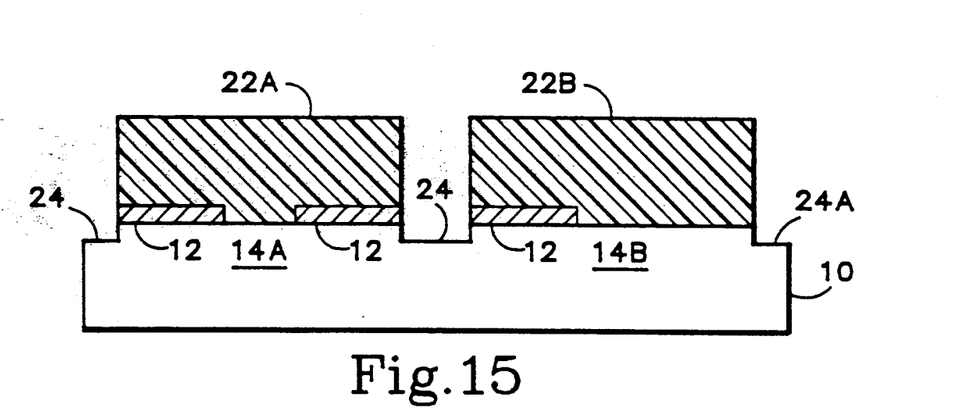
Figure 16:
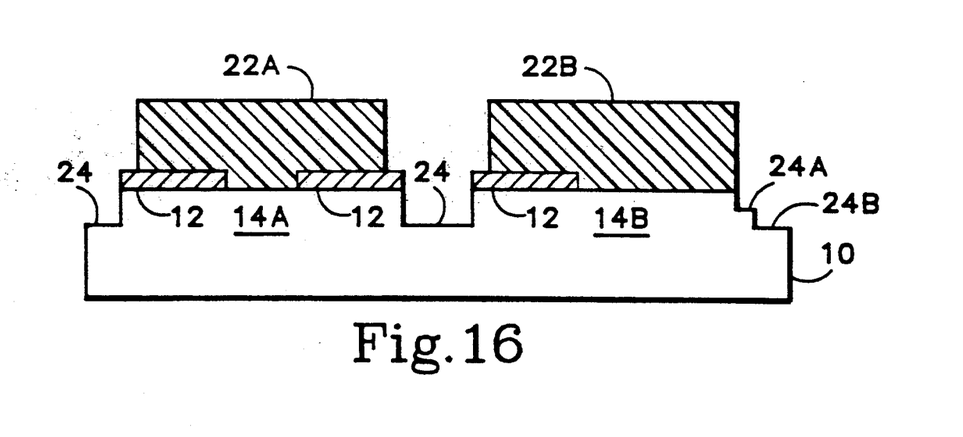
Figure 17:
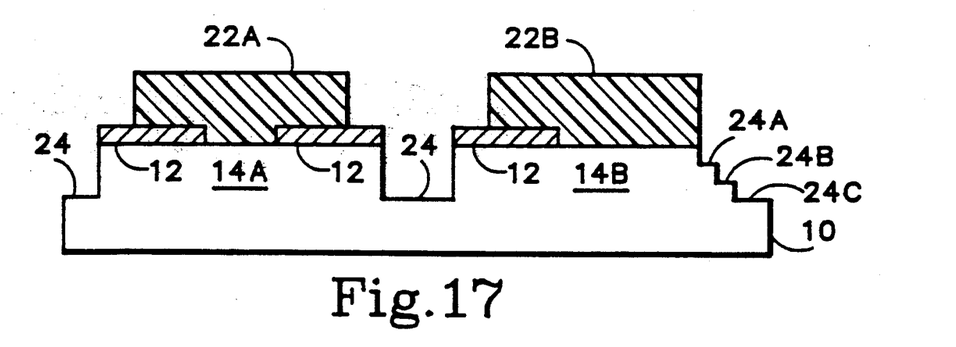
Figure 18:
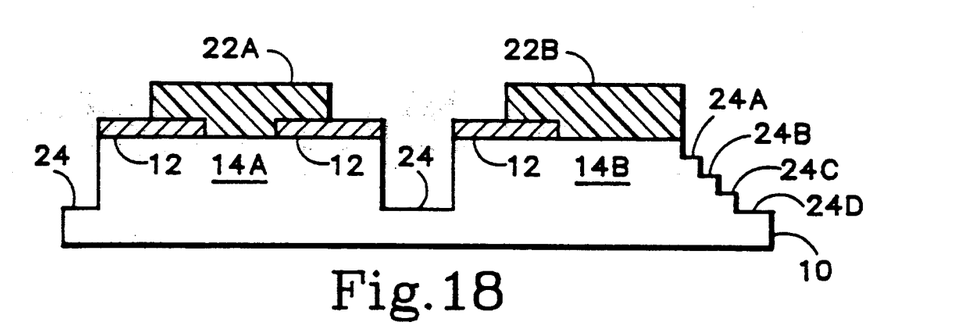

Referring now to FIG. 15, the surface of the photomask is covered with a patterned layer of photoresist 22

(represented by photoresist zones 22A and 22B). The photoresist zones are positioned over the areas of the photomask where the phase shifters are desired. Thus, in FIG. 15, a phase shifter will be created under photoresist zone 22A and photoresist zone 22B. To create the tapered edge of the phase shifter 14B, the photoresist layer 22 is isotropically etched to expose a portion of the surface of the phase shifter. The exposed surface of the phase shifter is etched in a separate etching step to create a stairstep 24A. The same oxygen/fluorine etching steps for etching photoresist and quartz ($SiO_2$) are used in the subtractive process. Either of the two etching steps may be performed first. The steps of isotropically etching the photoresist layer 22 and etching the exposed surface of the phase shifters 14A and 14B are repeated to create a plurality of successive stairsteps approximating a tapered edge.

Simultaneously with the creation of the first stairstep 24A, the vertical, optically opaque edges of phase shifters 14A and 14B are formed. As shown in FIG. 15, the quartz etching step creates trenches 24. The vertical edges of the trench are defined not by the photoresist zones, but by the dark features 12. Thus, trenches 24 are etched at the same rate as the stairsteps, but do not have a horizontal component since this the horizontal etch is blocked by the dark features 12. Thus, in FIG. 15 a first stairstep 24A and trenches 24 are formed simultaneously and have equal depth.

Figure 19:
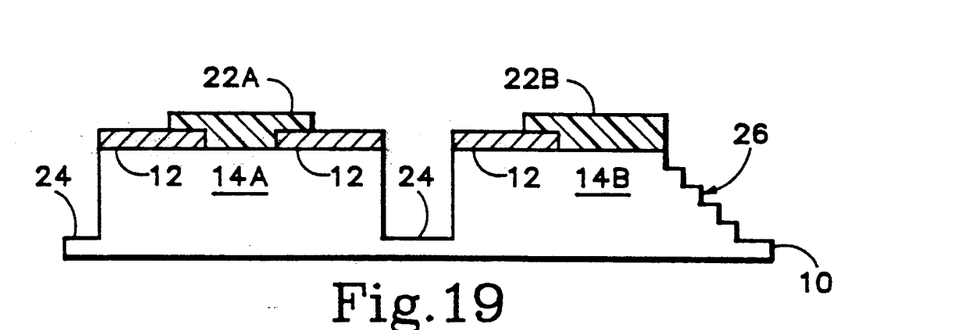
Figure 20:
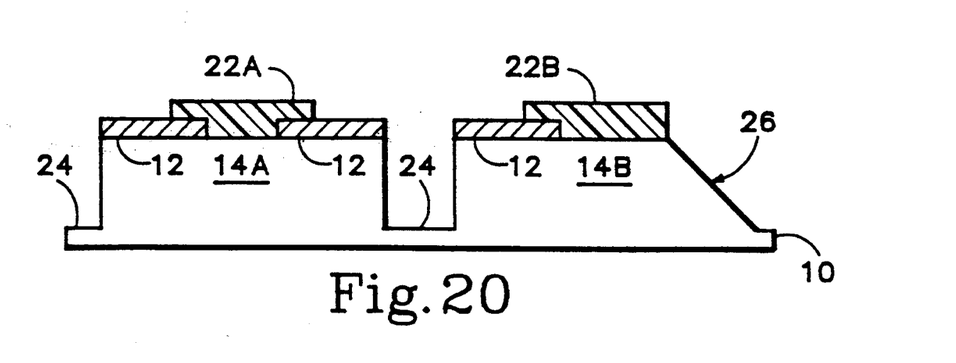

FIGS. 16-19 show increasing trench depth and the formation of additional stairsteps 24A-24D. In FIG. 19, the phase shifters 14A and 14B are complete. Phase shifter 14A is raised from the new surface of the photomask substrate 10 by the creation of trenches 24. Note that the sidewalls of the trenches 24 are substantially vertical and defined by the dark features 12. The right edge of phase shifter 14B has a tapered edge 26 approximated by stairsteps 24A-24D. Thus, in the subtractive method, only the optically clear edges of the phase shifters are tapered. The phase shifters 14 and the tapered edge 26, however, are created simultaneously. Separate operations are not required to form the phase shifters and to form the tapered edges.

If desired, the isotropic etching of the photoresist layer 22 and etching of the exposed surface of the phase shifters 14 can be performed simultaneously to create smooth, continuous tapered edges 26. For the steps to be performed simultaneously, the same combined oxygen/fluorine etch is used as in the additive method. The result of the simultaneous combined etching steps produces the smooth tapered edges 26 shown in FIG. 20. The tapered edge 26 is shown as straight lines having a 45 degree angle due to a constant ratio between the components of the oxygen/fluorine etch. Other smooth shapes can be created by varying the ratio between the components during the etching step. Note that the trench sidewalls remain vertical in the continuous etching method.

Having described and illustrated the principles of the invention in a preferred embodiment thereof, it should be apparent that the invention can be modified in arrangement and detail without departing from such principles. For example, the number and size of the stairsteps can be easily changed to accommodate the specifications of a given photomask process, as well as the exact dimensions of the phase shifters. Other type of etching techniques can also be used in addition to those described herein. We therefore claim all modifications and variation coming within the spirit and scope of the following claims.

We claim:

1. A method of preventing null information in a photoresist layer on an integrated circuit substrate caused by optically clear edges in a phase shifted photomask, the method comprising the steps of:
   providing a photomask having a clear substrate and a plurality of dark features;
   providing a plurality of clear phase shifting features raised from the substrate;
   terminating an end of at least one of the phase shifting features in an optically clear edge;
   tapering the optically clear edge of the phase shifting feature to form a tapered edge; and
   exposing the photoresist layer through the phase shifted photomask;
   the tapered edge being formed such that a null formed by the optically clear edge is spread out and is therefore not printed into the photoresist layer.

2. The method of claim 1 in which the tapering step comprises tapering the optically clear edge of the phase shifting feature such that the slope at any point along the tapered edge between the photomask substrate and the phase shifting feature is less than a predetermined printing angle.

3. The method of claim 2 in which the printing angle is equal to forty-five degrees.

4. The method of claim 1 in which the tapering step comprises the steps of:
   covering the phase shifting feature with a layer of photoresist;
   isotropically etching the photoresist layer to expose a portion of the surface of the phase shifting feature; and
   simultaneously etching the exposed surface of the phase shifting feature to create the tapered edge.

5. The method of claim 1 in which the tapering step comprises the steps of:
   covering the phase shifting feature with a layer of photoresist;
   isotropically etching the photoresist layer to expose a portion of the surface of the phase shifting feature;
   etching the exposed surface of the phase shifting feature to create a stairstep; and
   repeating the steps of isotropically etching the photoresist layer and etching the exposed surface of the phase shifting feature to create a plurality of successive stairsteps approximating a tapered edge.

6. The method of claim 1 in which the step of providing phase shifted features and the step of tapering the optically clear edge are performed simultaneously.

7. The method of claim 1 in which the step of providing phase shifting features comprises adding material to the substrate to create the raised phase shifting features.

8. The method of claim 1 in which the step of providing phase shifting features comprises removing material from the substrate to create the raised phase shifting features.

9. A method of preventing null formation in a photoresist layer on an integrated circuit substrate caused by optically clear edges in a phase shifted photomask, the method comprising the steps of:
   providing a photomask having a clear substrate and a plurality of dark features;
   etching portions of the substrate to lower the surface of the substrate and create a plurality of clear phase shifting features raised from the substrate having at least one optically opaque edge and at least one optically clear edge;

preserving the optically opaque edges of the phase shifting features;

tapering the optically clear edges of the phase shifting feature to form a tapered edge; and exposing the photoresist layer through the phase shifted photomask;

the tapered edge being formed such that a null formed by the optically clear edge is spread out and is therefore not printed into the photoresist layer.

10. The method of claim 9 in which the tapering step comprises tapering the optically clear edge of the phase shifting feature such that the slope at any point along the tapered edge between the photomask substrate and the phase shifting feature is less than a predetermined printing angle.

11. The method of claim 10 in which the printing angle is equal to forty five degrees.

12. The method of claim 9 in which the tapering step comprises the steps of:

covering the phase shifting feature with a layer of photoresist;

isotropically etching the photoresist layer to expose a portion of the surface of the phase shifting feature; and simultaneously etching the exposed surface of the phase shifting feature to create the tapered edge.

13. The method of claim 9 in which the tapering step comprises the steps of:

covering the phase shifting feature with a layer of photoresist;

isotropically etching the photoresist layer to expose a portion of the surface of the phase shifting feature;

etching the exposed surface of the phase shifting feature to create a stairstep; and repeating the steps of isotropically etching the photoresist layer and etching the exposed surface of the phase shifting feature to create a plurality of successive stairsteps approximating a tapered edge.

14. The method of claim 9 in which the step of etching portions of the substrate and the step of tapering the optically clear edge are performed simultaneously.

15. A method of preventing null formation in a photoresist layer on an integrated circuit substrate caused by optically clear edges in a phase shifted photomask, the method comprising the steps of:

providing a photomask having a clear substrate and a plurality of dark features;

adding a plurality of clear phase shifting features to the surface of the substrate;

tapering the edges of the phase shifting features to form tapered edges; and exposing the photoresist layer through the phase shifted photomask;

the tapered edge being formed such that a null formed by the optically clear edge is spread out and is therefore not printed into the photoresist layer.

16. The method of claim 15 in which the tapering step comprises tapering the optically clear edge of the phase shifting feature such that the slope at any point along the tapered edge between the photomask substrate and the phase shifting feature is less than a predetermined printing angle.

17. The method of claim 16 in which the printing angle is equal to forty-five degrees.

18. The method of claim 15 in which the adding step and the tapering step are performed simultaneously.

19. The method of claim 18 in which the simultaneous adding and tapering step comprises the steps of:

covering the entire surface of the photomask with a phase shifting layer;

covering the phase shifting layer with a patterned layer of photoresist;

isotropically etching the photoresist layer; and simultaneously etching the entire exposed surface of the phase shifting layer to create the clear phase shifting features having tapered edges.

20. The method of claim 18 in which the simultaneous adding and tapering step comprises the steps of:

covering the entire surface of the photomask with a phase shifting layer;

covering the phase shifting feature with a patterned layer of photoresist;

isotropically etching the photoresist layer to expose a portion of the surface of the phase shifting layer;

etching the entire exposed surface of the phase shifting layer to create a stairstep; and repeating the steps of isotropically etching the photoresist layer and etching the entire exposed surface of the phase shifting layer to create a plurality of successive stairsteps approximating a tapered edge.

21. A phase shifted photomask for selectively exposing a photoresist layer on an integrated circuit substrate comprising:

a photomask having a clear substrate and a plurality of dark features; and a plurality of clear phase shifting features raised from the substrate having at least one optically clear edge;

the optically clear edge being tapered such that a null formed by the optically clear edge is spread out and is therefore not printed into the photoresist layer.

22. The photomask of claim 21 in which the tapered edge of the phase shifting feature comprises a curve between the photomask substrate and the phase shifting feature having a slope at any point along the curve less than a predetermined printing angle.

23. The photomask of claim 22 in which the predetermined printing angle is equal to forty-five degrees.

24. The photomask of claim 21 in which the clear photomask substrate is comprised of a material selected from the group consisting of $SiO_2$ and $Si_3N_4$.

25. The photomask of claim 21 in which the dark features are comprised of a material selected from the group consisting of chrome, aluminum, iron oxide, tungsten, and gold.

26. The photomask of claim 21 in which the clear phase shifting features are comprised of a material selected from the group consisting of $SiO_2$ and $Si_3N_4$.

* * * * *